(12) United States Patent
Kondo et al.

(10) Patent No.: US 9,324,798 B2
(45) Date of Patent: Apr. 26, 2016

(54) SEMICONDUCTOR DEVICE AND METHOD FOR MANUFACTURING THE SAME

(71) Applicant: Kabushiki Kaisha Toshiba, Minato-ku, Tokyo (JP)

(72) Inventors: Yoshiyuki Kondo, Yokohama (JP); Akira Hokazono, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 78 days.

(21) Appl. No.: 13/919,917

(22) Filed: Jun. 17, 2013

(65) Prior Publication Data

US 2014/0209863 A1     Jul. 31, 2014

(30) Foreign Application Priority Data

Jan. 28, 2013   (JP) .................................. 2013-013150

(51) Int. Cl.
| | |
|---|---|
| *H01L 29/06* | (2006.01) |
| *H01L 29/08* | (2006.01) |
| *H01L 29/66* | (2006.01) |
| *H01L 29/739* | (2006.01) |

(52) U.S. Cl.
CPC ........ *H01L 29/0843* (2013.01); *H01L 29/0895* (2013.01); *H01L 29/66356* (2013.01); *H01L 29/7391* (2013.01)

(58) Field of Classification Search
CPC ......... H01L 29/06; H01L 29/78; H01L 29/66; H01L 29/73; H01L 27/092; H01L 21/366; H01L 29/76; H01L 21/823

USPC ........... 257/29, 345, 408, 288, 187, 192, 337, 257/344, 350, 401, 299, 322, 202, 336, 341
See application file for complete search history.

(56) References Cited

U.S. PATENT DOCUMENTS

| | | | |
|---|---|---|---|
| 8,368,127 B2 | 2/2013 | Zhu et al. | |
| 2007/0018202 A1* | 1/2007 | Zhu ............................... | 257/213 |

(Continued)

FOREIGN PATENT DOCUMENTS

JP        2012169433 A      9/2012

OTHER PUBLICATIONS

Chemming Hu et al.: "Green Transistor—A $V_{DD}$ Scaling Path for Future Low Power Ics": IEEE 2008: 2 Pages (in English).

(Continued)

*Primary Examiner* — Chuong A Luu
(74) *Attorney, Agent, or Firm* — Holtz, Holtz & Volek PC

(57) ABSTRACT

In one embodiment, a semiconductor device includes a first diffusion layer of a first conductive type and a second diffusion layer of a second conductive type which is a reverse conductive type of the first conductive type, the first conductive type first diffusion layer and the second conductive type diffusion layer being spaced apart and provided in a semiconductor layer, a pocket region of the second conductive type which is provided on a surface portion of the semiconductor layer adjacently to the first diffusion layer, and a first extension region of the first conductive type which is provided in the semiconductor layer to cover at least a portion of the pocket region. A second diffusion layer side end portion of the first extension region is positioned closer to a second diffusion layer side than a second diffusion layer side end portion of the pocket region.

10 Claims, 16 Drawing Sheets

(56) References Cited

U.S. PATENT DOCUMENTS

| | | |
|---|---|---|
| 2009/0026553 A1 | 1/2009 | Bhuwalka et al. |
| 2009/0045459 A1* | 2/2009 | Okabe .......................... 257/335 |
| 2010/0244149 A1* | 9/2010 | Bulucea et al. ............... 257/408 |
| 2011/0042757 A1 | 2/2011 | Tan et al. |
| 2011/0147838 A1* | 6/2011 | Gossner et al. ............... 257/345 |
| 2011/0169078 A1* | 7/2011 | Yang et al. .................... 257/336 |
| 2011/0303950 A1 | 12/2011 | Lauer et al. |
| 2012/0205751 A1 | 8/2012 | Ohguro |
| 2012/0228706 A1 | 9/2012 | Sugizaki et al. |
| 2013/0134504 A1 | 5/2013 | Kondo et al. |
| 2014/0017869 A1* | 1/2014 | Nandakumar et al. ........ 438/301 |
| 2014/0054657 A1* | 2/2014 | Hokazono et al. ............ 257/288 |

OTHER PUBLICATIONS

Japanese Office Action (and English translation thereof) dated Feb. 26, 2016, issued in counterpart Japanese Application No. 2013-013150.

* cited by examiner

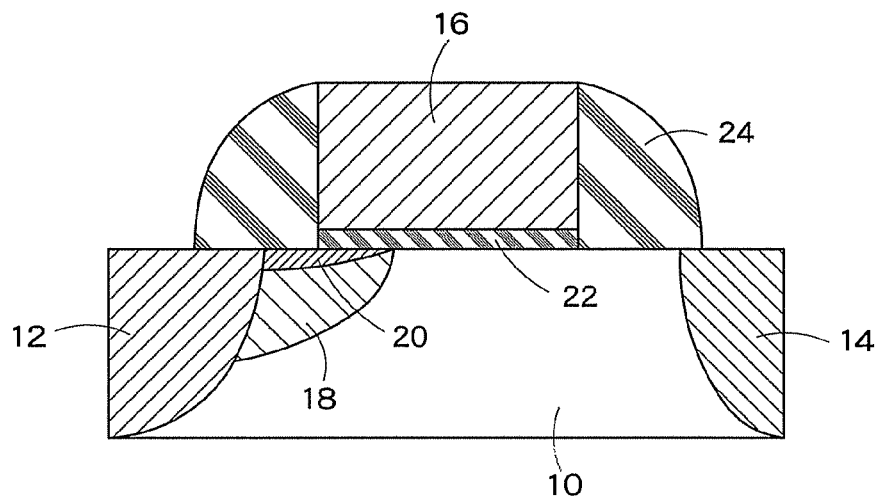
F I G. 1
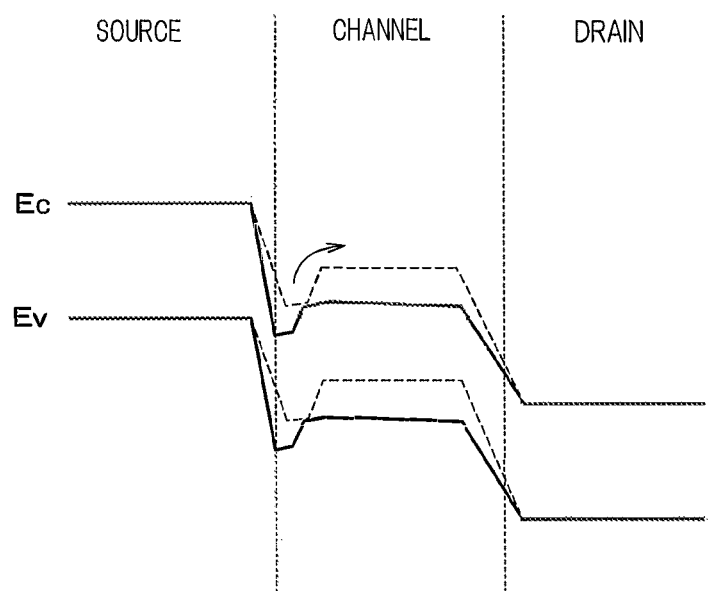
F I G. 2

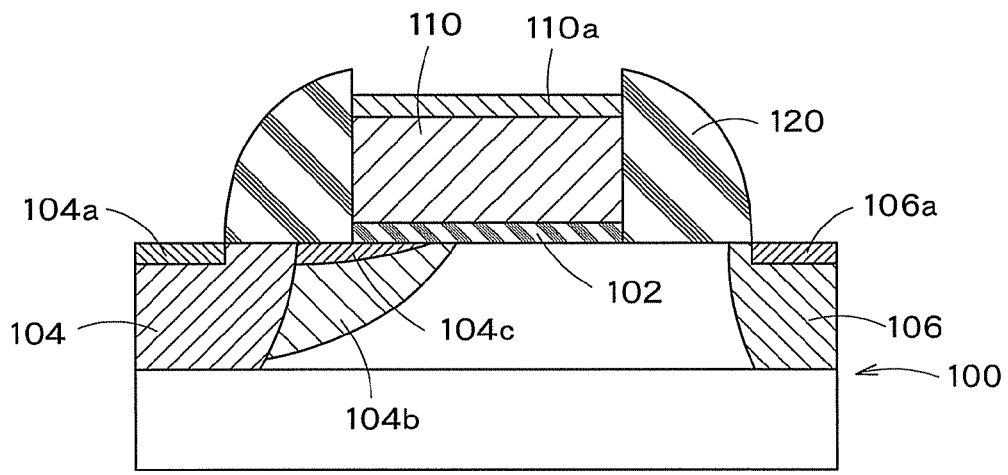
F I G. 3
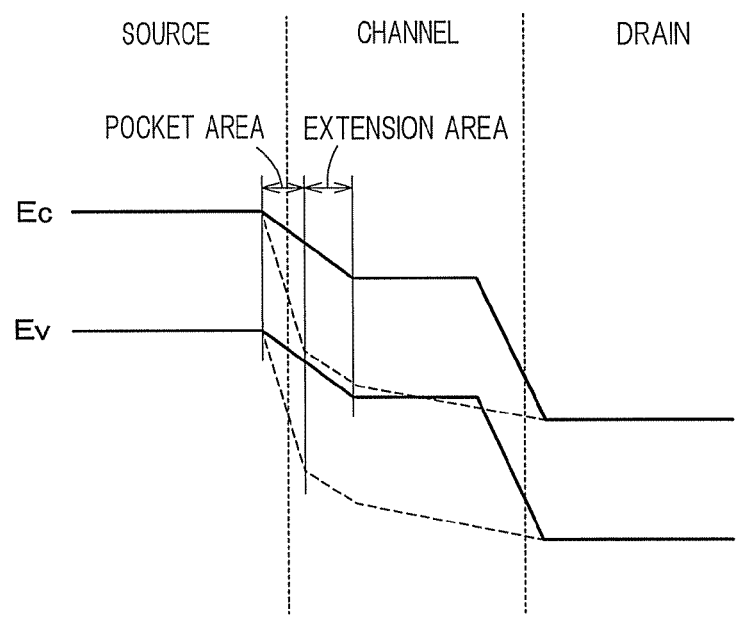
F I G. 4

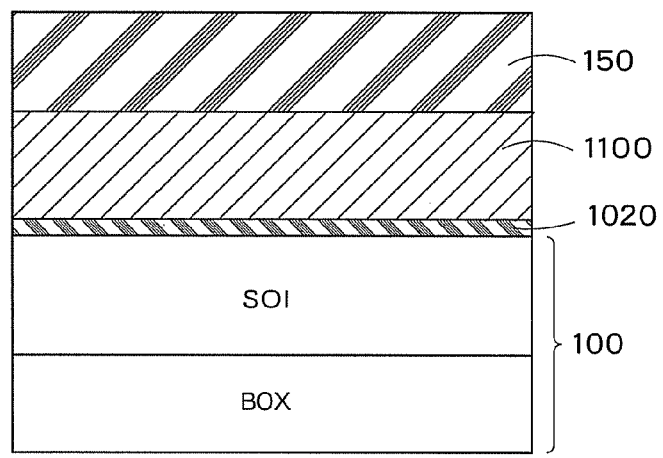
F I G. 7A
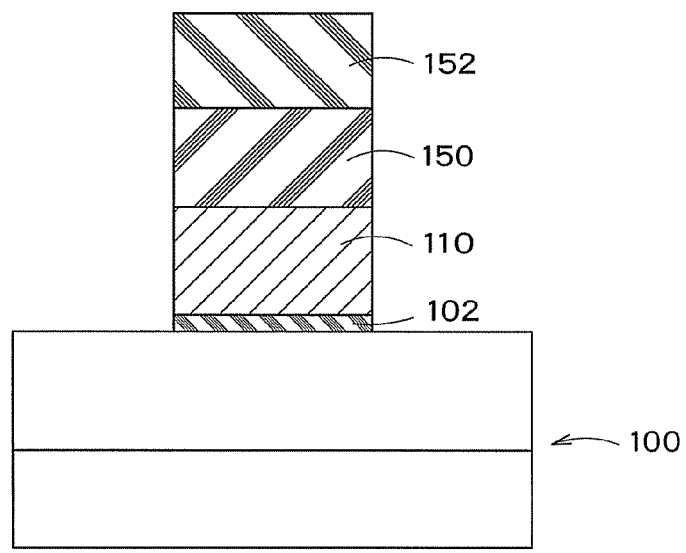
F I G. 7B
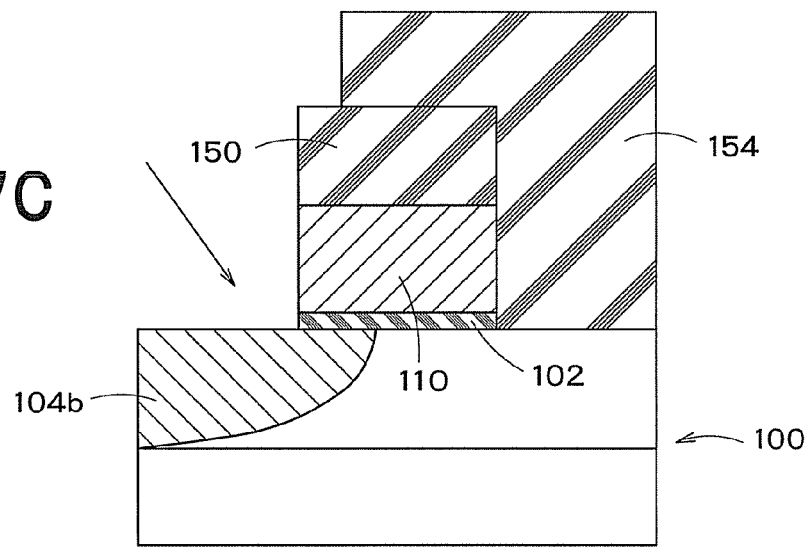
F I G. 7C

F I G. 7J
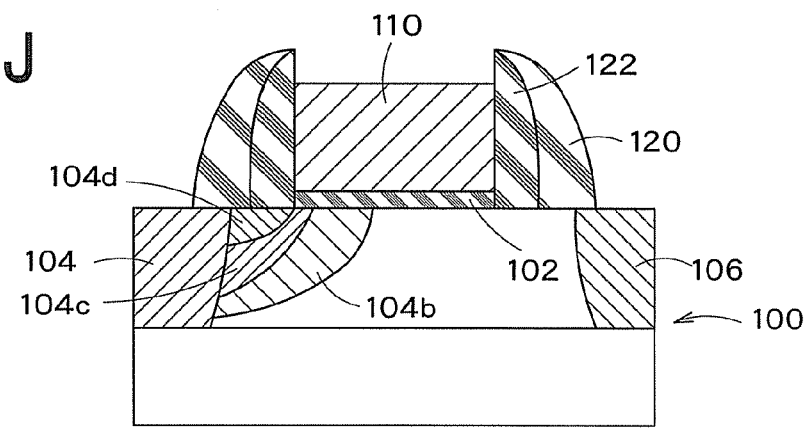
F I G. 7K
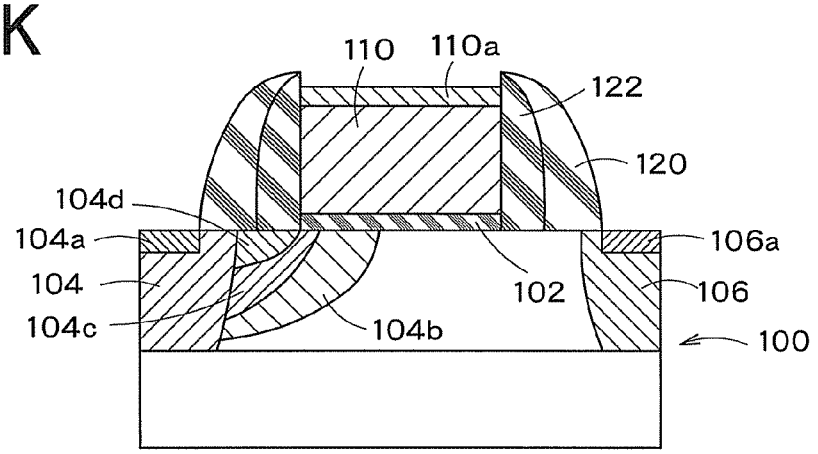

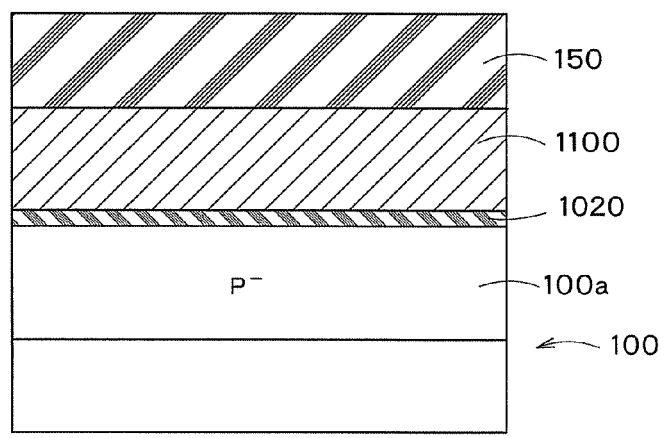
F I G. 8A
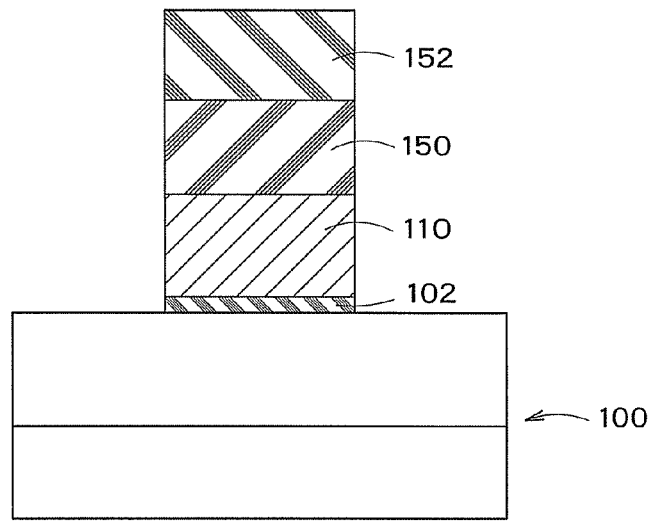
F I G. 8B
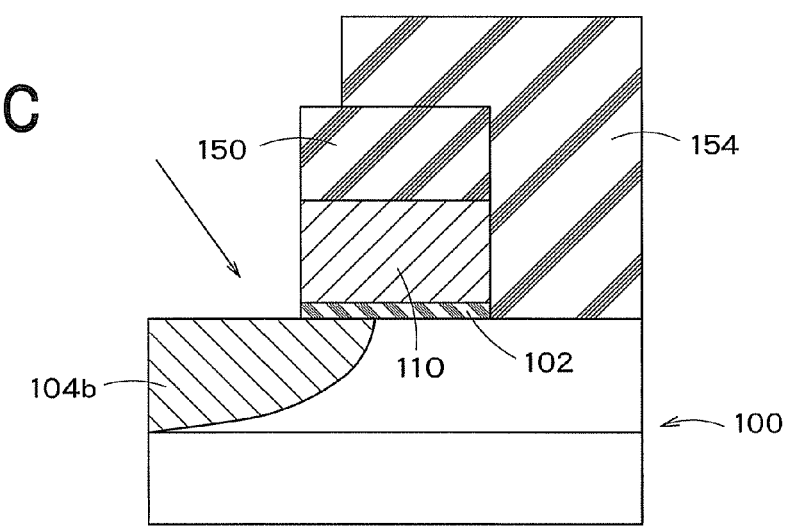
F I G. 8C

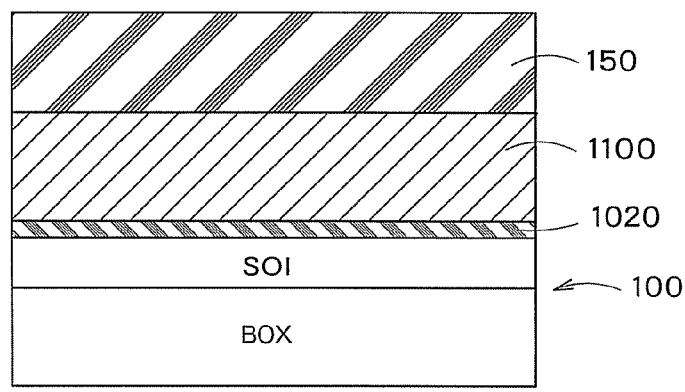
F I G. 9A
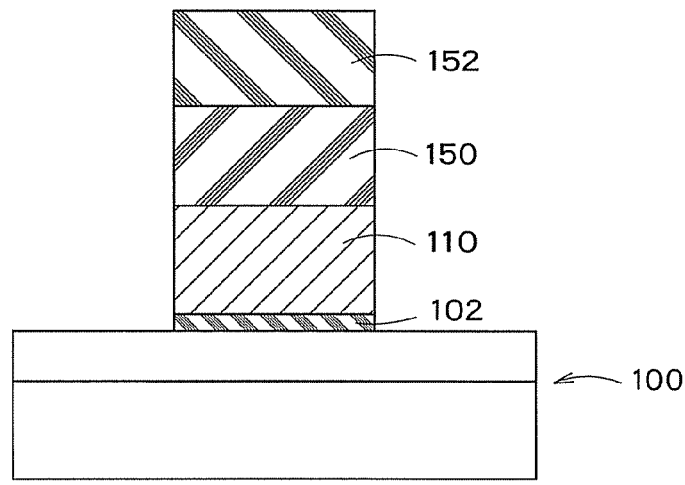
F I G. 9B
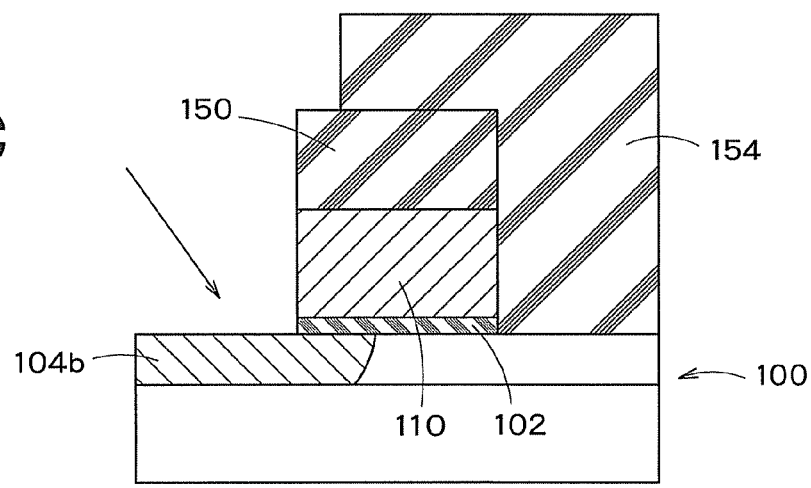
F I G. 9C

SEMICONDUCTOR DEVICE AND METHOD FOR MANUFACTURING THE SAME

CROSS REFERENCE TO RELATED APPLICATION

This application is based upon and claims benefit of priority from the Japanese Patent Application No. 2013-13150, filed on Jan. 28, 2013, the entire contents of which are incorporated herein by reference.

FIELD

Embodiments described herein relate generally to a semiconductor device and a method for manufacturing the same.

BACKGROUND

A tunnel field effect transistor (TFET) is a transistor which has different types of source and drain semiconductors, which has asymmetric diffusion layers and to which an LSI of little power consumption is applicable. A p-n-i-n type TFET is known in which a pocket region which has conductivity opposite to a source is inserted on a source side.

However, there is a problem that, in a conventional p-n-i-n type TFET, an inversion layer and a pocket region are joined, thereby increasing junction leakage and deteriorating subthreshold swing (referred to as "SS" below). Further, a mode of MOSFET deriving from a parasitic n-i-n type structure appears, and therefore there is a problem that steep SS cannot be realized.

BRIEF DESCRIPTION OF THE DRAWINGS

FIG. 1 is a schematic view illustrating a tunnel transistor according to Comparative Example;

FIG. 2 is an energy band view according to Comparative Example;

FIG. 3 is a schematic configuration diagram of a semiconductor device according to a first embodiment;

FIG. 4 is an energy band view according to the first embodiment;

FIG. 7A is a process cross-sectional view explaining a method of manufacturing the semiconductor device according to the second embodiment;

FIG. 7B is a process cross-sectional view subsequent to FIG. 7A;

FIG. 7C is a process cross-sectional view subsequent to FIG. 7B;

FIG. 7J is a process cross-sectional view subsequent to FIG. 7I;

FIG. 7K is a process cross-sectional view subsequent to FIG. 7J;

FIG. 8A is a process cross-sectional view explaining a method of manufacturing the semiconductor device according to a third embodiment;

FIG. 8B is a process cross-sectional view subsequent to FIG. 8A;

FIG. 8C is a process cross-sectional view subsequent to FIG. 8B;

FIG. 9A is a process cross-sectional view explaining a method of manufacturing the semiconductor device according to a fourth embodiment;

FIG. 9B is a process cross-sectional view subsequent to FIG. 9A;

FIG. 9C is a process cross-sectional view subsequent to FIG. 9B;

DETAILED DESCRIPTION

Figure 5A:
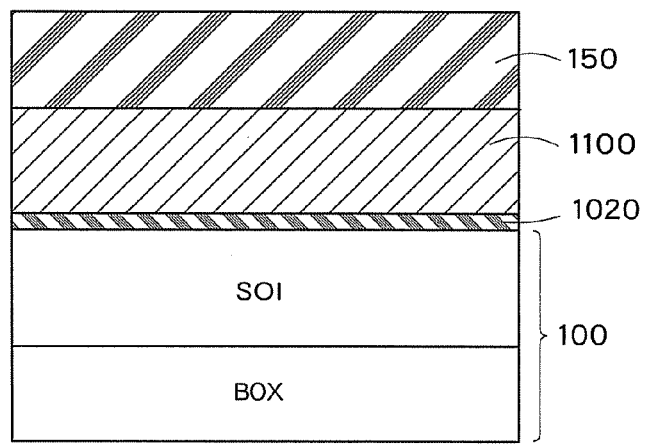
FIG. 5A is a process cross-sectional view explaining a method of manufacturing the semiconductor device according to the first embodiment.

According to one embodiment, a semiconductor device includes a first diffusion layer of a first conductive type and a second diffusion layer of a second conductive type which is a reverse conductive type of the first conductive type, the first conductive type first diffusion layer and the second conductive type diffusion layer being spaced apart and provided in a semiconductor layer, a gate insulation film which is provided on the semiconductor layer between the first diffusion layer and the second diffusion layer, a gate electrode which is provided on the gate insulation film, a pocket region of the second conductive type which is provided on a surface portion of the semiconductor layer adjacently to the first diffusion layer, and a first extension region of the first conductive type which is provided in the semiconductor layer to cover at least a portion of the pocket region. A second diffusion layer side end portion of the first extension region is positioned closer to a second diffusion layer side than a second diffusion layer side end portion of the pocket region.

Prior to explanation of embodiments of the present invention, a background that the inventors made the present invention will be described.

FIG. 1 is a schematic view of a tunnel transistor, a P type source region (source electrode) 12 and an N type drain region (drain electrode) 14 are provided in a substrate 10 sandwiching a gate electrode 16. Between the source region 12 and the drain region 14, a P type source extension region 18 and an N type pocket region 20 are formed adjacently to the source region 12. The source extension region 18 has the same type as that of the source region 12, and the pocket region 20 has a type opposite to that of the source region 12. The pocket region 20 is formed on a surface portion of the semiconductor substrate 10, and is extended below an end portion of the gate electrode 16. Further, a lower side of the pocket region 20 is in contact with the source extension region 18, and a drain side end portion is in contact with a semiconductor layer of the substrate 10. In other words, in a source-drain direction (a horizontal direction in FIG. 1), the drain side end portion of the pocket region 20 is positioned at the same position as that of the drain side end portion of the source extension region 18 or closer to a drain side than the drain side end portion of the source extension region 18.

The gate electrode 16 is provided on the substrate 10 across a gate insulation film 22. Further, at sidewall portions of the gate electrode 16, sidewall insulation films 24 are provided.

FIG. 2 illustrates an energy band diagram upon turning on and off of this tunnel transistor. The illustration of the band diagram goes from an region in which tunneling of a source occurs to a conduction direction to a drain.

When the source electrode 12 has 0 V and a positive potential is applied to the drain electrode 14, a current value flowing between the source and the drain changes based on the potential to be applied to the gate electrode 16. When a bias Vg=0 V is applied to the gate electrode 16, an off state in which a current value is very low is realized and bands corresponding to solid lines in FIG. 2 are obtained. Meanwhile, Ec indicates energy in a conduction band, and Ev indicates energy in a valence band. The pocket region 20 is formed, and therefore there are concavities and convexities in a source region of the bands.

When a positive potential (Vg>0) is applied to the gate electrode 16, the band in the channel is bent toward the valence band, and bands corresponding to broken lines in FIG. 2 are obtained. When the lowest energy of the conduction band of the channel goes below the highest energy of the valence band of the source, electrons occupying the valence band of the source move to the conduction band in the channel, and band to band tunneling (BTBT) occurs. When the tunneling electrons move to the conduction band of the channel, the electrons are influenced by an electric field and a concentration gradient, are transported and reach the drain electrode, and then a current flows. Meanwhile, after tunneling, holes are produced in the valence band in the source.

These holes reach the source electrode according to the electric field and the concentration gradient in the source.

However, when an on state as illustrated in FIG. 2 is realized, electrons in the channel need to get over an energy barrier as indicated by an arrow in FIG. 2, and, in such an operation mode, SS (Sub-threshold Swing) has a lower limit of physical limit value of MOSFET under temperature-fixed operation and therefore it was not possible to realize steep SS. Further, a channel inversion layer and the pocket region 20 are joined and junction leakage increases, and therefore SS deteriorates.

The above problem will be solved in the following embodiments. Hereinafter, embodiments of the present invention will be described based on drawings.

(First Embodiment) FIG. 3 is a cross-sectional view of a semiconductor device according to a first embodiment. The semiconductor device is an N type tunnel transistor which has a gate insulation film 102 which is formed on a semiconductor substrate (semiconductor layer) 100, a gate electrode 110 which is formed on the gate insulation film 102, and a P type source region (source electrode) 104 and an N type drain region (drain electrode) 106 which are formed sandwiching the gate electrode 110 in the semiconductor substrate 100. The semiconductor substrate 100 is, for example, a SOI substrate.

On both sidewall portions of the gate electrode 110, sidewall insulation films 120 are formed.

As illustrated in FIG. 3, between the source region 104 and the drain region 106, a P type source extension region 104b and an N type pocket region 104c are formed adjacently to the source region 104. The source extension region 104b has the same type as that of the source region 104, and the pocket region 104c has a type opposite to that of the source region 104.

The pocket region 104c is formed on a surface portion of the semiconductor substrate 100, and is extended below an end portion of the gate electrode 110. Further, (a drain side of) the pocket region 104c is covered by the source extension region 104b. In other words, in a source-drain direction (a horizontal direction in FIG. 3), the drain side end portion of the source extension region 104b is positioned closer to a drain side than the drain side end portion of the pocket region 104c.

On top surface portions of the source region 104, the drain region 106 and the gate electrode 110, suicide layers 104a, 106a and 110a are respectively formed.

FIG. 4 illustrates an energy band diagram upon turning on and off of the N type tunnel transistor illustrated in FIG. 3. The illustration of the band diagram goes from an region in which tunneling of a source occurs to a conduction direction to a drain.

When the source electrode 104 has 0 V and a positive potential is applied to the drain electrode 106, a current value flowing between the source and the drain changes based on the potential to be applied to the gate electrode 110. When a bias Vg=0 V is applied to the gate electrode 110, an off state in which a current value is very low is realized and bands corresponding to solid lines in FIG. 4 are obtained. Meanwhile, Ec indicates energy in a conduction band, and Ev indicates energy in a valence band. By forming the source extension region 104b adjacently to the pocket region 104c in the source-drain direction, the pocket region 104c is completely depleted and concavities and convexities are removed from the bands.

When a positive potential (Vg>0) is applied to the gate electrode 110, bands corresponding to broken lines in FIG. 4 are obtained. BTBT of the tunnel transistor illustrated in FIG.

3 occurs in a vertical direction (channel-gate direction). Electrons tunneled from the source to the channel do not have energy barriers, so that there is no restriction realized by the MOSFET mode and steep SS can be realized.

Further, according to the present embodiment, the pocket region 104c is covered by the source extension region 104b, so that it is possible to prevent a channel inversion layer and the pocket region 104c from joining and junction leakage from increasing.

Thus, according to the present embodiment, it is possible to prevent sub-threshold swing from deteriorating.

Next, a method of manufacturing the semiconductor device according to the present embodiment will be described using FIGS. 5A to 5I.

First, as illustrated in FIG. 5A, a silicon oxide film 1020 which becomes the gate insulation film 102 is formed on the SOI substrate of a BOX (Buried Oxide)-SOI (Silicon on Insulator) structure which becomes the semiconductor substrate 100 by a thermal oxidation method. Subsequently, an electrode material 1100 for the gate electrode 110 is deposited on the silicon oxide film 1020 by way of CVD (Chemical Vapor Deposition). The electrode material is, for example, polysilicon, and is doped with N type impurities such as phosphorus. Further, an insulation film (gate hard mask material) 150 such as $Si_3N_4$ film is formed on the electrode material.

The semiconductor substrate 100 may be, for example, a III-V compound semiconductor substrate. Further, the gate insulation film 102 and the gate electrode 110 may adopt a high-k/metal laminated structure instead of a thermally-oxidized film/polysilicon laminated structure.

Figure 5B:
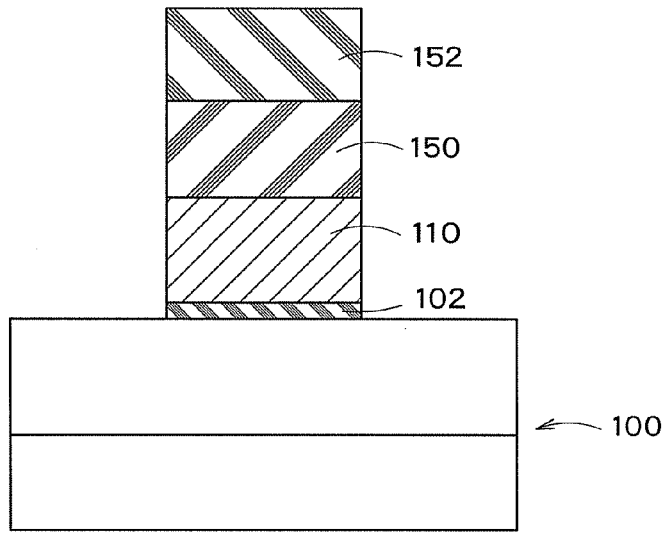
FIG. 5B is a process cross-sectional view subsequent to FIG. 5A.

Next, as illustrated in FIG. 5B, a resist 152 is coated on the insulation film 150, and the insulation film 150 is processed by lithography and RIE (Reactive Ion Etching). Further, the electrode material 1100 and the silicon oxide film 1020 are processed using the insulation film 150 as a mask to form the gate electrode 110 and the gate insulation film 102. Before the gate electrode 110 and the gate insulation film 102 are formed, the resist 152 may be peeled.

Figure 5C:
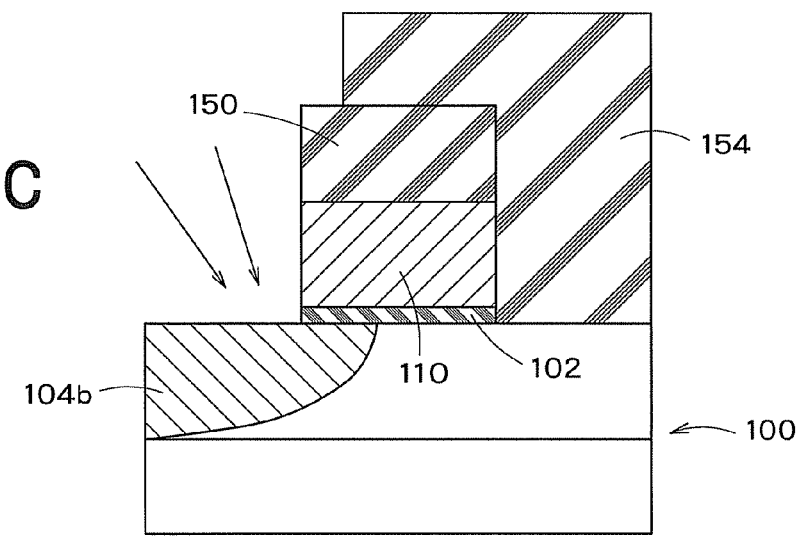
FIG. 5C is a process cross-sectional view subsequent to FIG. 5B.

Next, as illustrated in FIG. 5C, a resist 154 which covers a drain side is formed by a lithography method. Further, ions are injected to form the source extension region 104b. In this case, for example, B or $BF_2$ is used as ion species and is injected to the semiconductor substrate 100 by tilting a beam such that the ion species go around to a lower portion of the gate electrode 110. For example, ions are injected twice by changing injection angles, and the injection amount at a high tilt angle is made smaller than the injection amount of a low tilt angle.

Figure 5D:
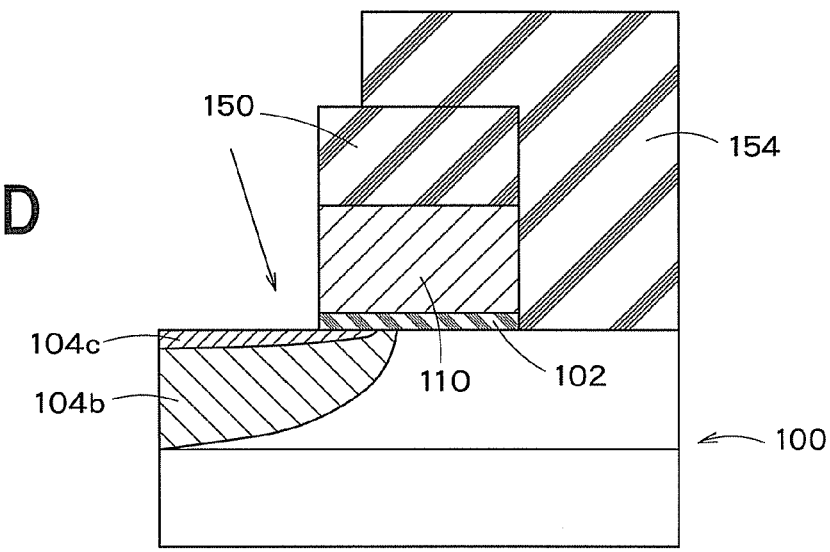
FIG. 5D is a process cross-sectional view subsequent to FIG. 5C.

Next, as illustrated in FIG. 5D, ions are injected using arsenic or phosphorus to form the pocket region 104c on the surface portion of the semiconductor substrate 100. The ions are injected at the low tilt angle or vertically with respect to the semiconductor substrate 100. After ion injection, anneal processing such as RTA is performed to perform crystalline recovery.

After source side silicon is selectively etched, epitaxial growth of the silicon including the N type impurity may be caused only on the source side to form the pocket region 104c.

Ions are injected at a higher tilt angle in process illustrated in FIG. 5C than that in process illustrated in FIG. 5D, in a source-drain direction (a horizontal direction in FIG. 5), the drain side end portion of the source extension region 104b is positioned closer to a drain side than the drain side end portion of the pocket region 104c.

Figure 5E:
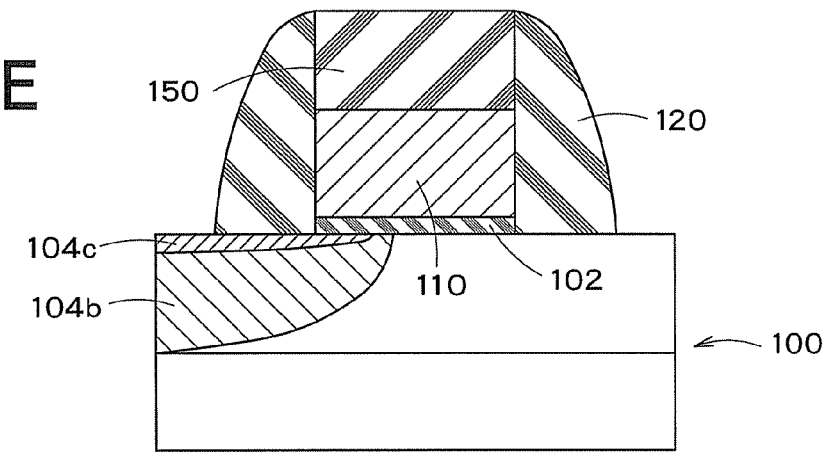
FIG. 5E is a process cross-sectional view subsequent to FIG. 5D.

Next, as illustrated in FIG. 5E, after the resist 154 is peeled, the sidewall insulation films 120 are formed on both side surfaces of the gate electrode 110. The sidewall insulation films 120 are formed by, for example, depositing sidewall insulation film 120 TEOS films on the entire surface on the semiconductor substrate 100 by CVD, and anisotropic etching these TEOS films by RIE.

Figure 5F:
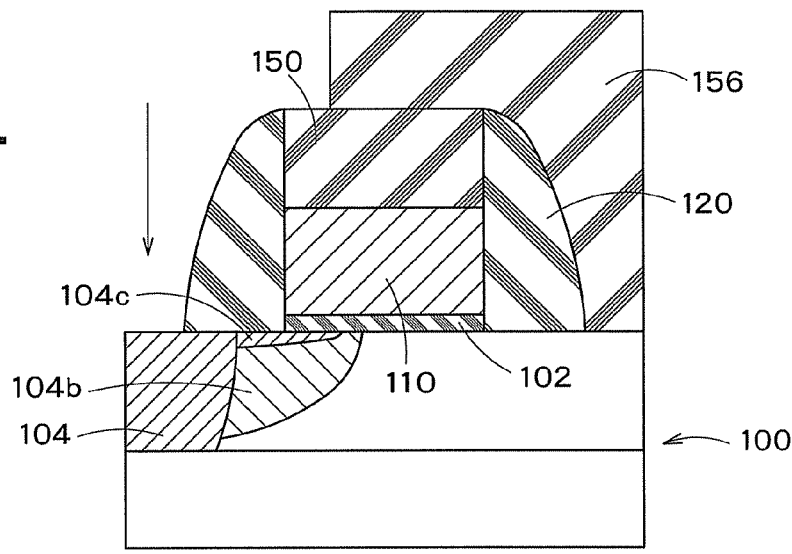
FIG. 5F is a process cross-sectional view subsequent to FIG. 5E.

Next, as illustrated in FIG. 5F, a resist 156 which covers the drain side is formed by the lithography method. Further, ions are injected to form the source region 104. In this case, B or $BF_2$ is used as ion species.

Figure 5G:
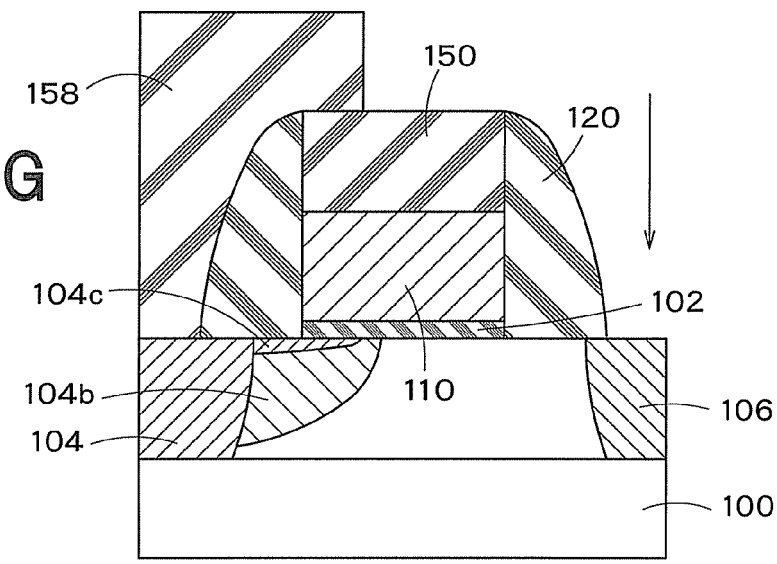
FIG. 5G is a process cross-sectional view subsequent to FIG. 5F.

Next, as illustrated in FIG. 5G, after the resist 156 is peeled, a resist 158 which covers the source side is formed by the lithography method. Further, ions are injected to form the drain region 106. In this case, As or P is used as ion species.

Further, after the resist 158 is peeled, anneal processing such as RTA is performed to activate impurities.

Figure 5H:
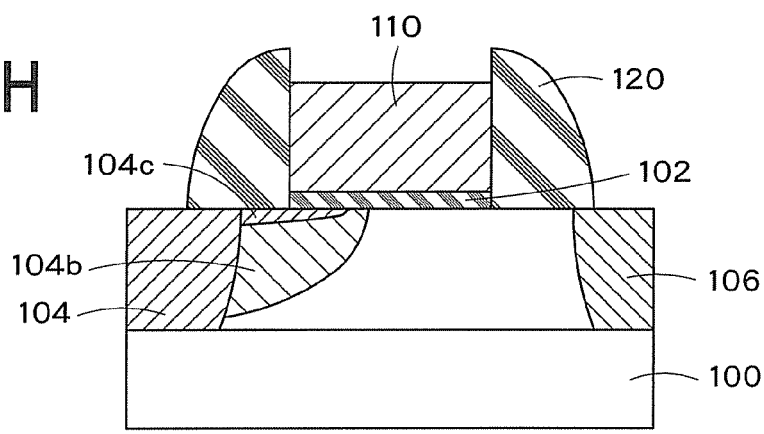
FIG. 5H is a process cross-sectional view subsequent to FIG. 5G.

Next, as illustrated in FIG. 5H, the insulation film 150 on the gate electrode 110 is peeled by wet etching.

Figure 5I:
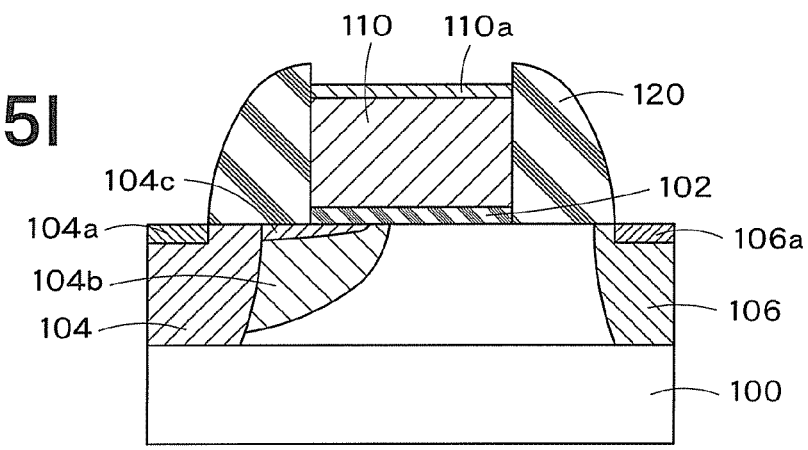
FIG. 5I is a process cross-sectional view subsequent to FIG. 5H.

Next, as illustrated in FIG. 5I, silicide layers 104a, 106a and 110a are formed in a self-aligning manner by salicide process. The silicide layer is, for example, an alloy with low resistance silicon such as NiSi, $NiSi_2$ and $Co_2Si$.

Thus, as illustrated in FIG. 3, a tunnel transistor is manufactured in which the pocket region 104c is covered by the source extension region 104b and which prevents deterioration of sub-threshold swing.

Figure 6:
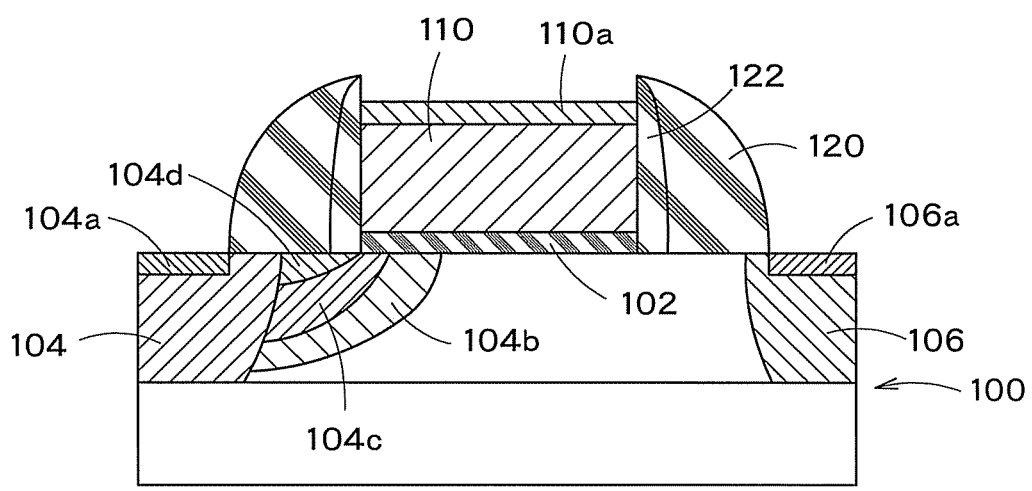
FIG. 6 is a schematic configuration diagram of a semiconductor device according to a second embodiment.

(Second Embodiment) Although BTBT of a tunnel transistor occurs in a vertical direction (channel-gate direction) in the above first embodiment, a configuration in which BTBT occurs in a horizontal direction (source-drain direction) may be employed as illustrated in FIG. 6. The present embodiment differs from the first embodiment illustrated in FIG. 3 in that a second source extension region 104d is provided on a surface portion of a semiconductor substrate 100. The same portions in FIG. 6 as those illustrated in FIG. 3 in the first embodiment will be assigned the same reference numerals, and will not be described.

The second source extension region 104d has the same type (P type) as those of a source region 104 and a source extension region 104b. Further, an impurity concentration of the second source extension region 104d is higher than an impurity concentration of the source extension region 104b.

An energy band which is illustrated in FIG. 6 and which illustrates that an N tunnel transistor is turned on and off is the same as that in FIG. 4. Consequently, it is possible to prevent deterioration of sub-threshold swing similar to the first embodiment.

Next, a method of manufacturing the semiconductor device according to the present embodiment will be described using FIGS. 7A to 7K.

First, as illustrated in FIG. 7A, a silicon oxide film 1020 which becomes a gate insulation film 102 is formed on the SOI substrate of a BOX (Buried Oxide)-SOI (Silicon on Insulator) structure which becomes the semiconductor substrate 100 by a thermal oxidation method. Subsequently, an electrode material 1100 for a gate electrode 110 is deposited on the silicon oxide film 1020 by way of CVD (Chemical Vapor Deposition). The electrode material is, for example, polysilicon, and is doped with N type impurities such as phosphorus. Further, an insulation film (gate hard mask material) 150 such as $Si_3N_4$ film is formed on the electrode material.

The semiconductor substrate 100 may be, for example, a III-V compound semiconductor substrate. Further, the gate insulation film 102 and a gate electrode 110 may adopt a high-k/metal laminated structure instead of a thermally-oxidized film/polysilicon laminated structure.

Next, as illustrated in FIG. 7B, a resist 152 is coated on the insulation film 150, and the insulation film 150 is processed by lithography and RIE (Reactive Ion Etching). Further, the electrode material 1100 and the silicon oxide film 1020 are processed using the insulation film 150 as a mask to form the gate electrode 110 and the gate insulation film 102. Before the gate electrode 110 and the gate insulation film 102 are formed, the resist 152 may be peeled.

Next, as illustrated in FIG. 7C, a resist 154 which covers a drain side is formed by a lithography method. Further, ions are injected to form the source extension region 104b. In this case, for example, B or $BF_2$ is used as ion species and is injected to the semiconductor substrate 100 by tilting a beam such that the ion species go around to a lower portion of the gate electrode 110.

Figure 7D:
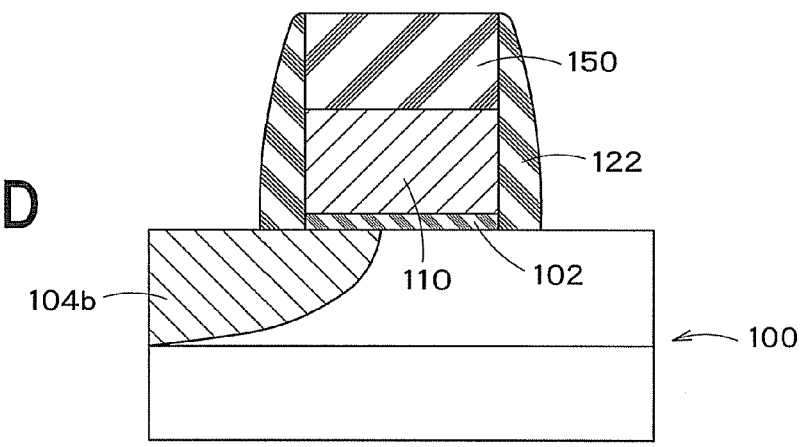
FIG. 7D is a process cross-sectional view subsequent to FIG. 7C.

Next, as illustrated in FIG. 7D, after the resist 154 is peeled, sidewall insulation films (offset spacers) 122 are formed on both side surfaces of the gate electrode 110. The sidewall insulation films 122 are formed by, for example, depositing sidewall insulation film 122 TEOS films on the entire surface on the semiconductor substrate 100 by CVD, and anisotropic etching these TEOS films by RIE. The sidewall insulation films 122 may be, for example, other insulation films such as $Si_3N_4$ films.

Figure 7E:
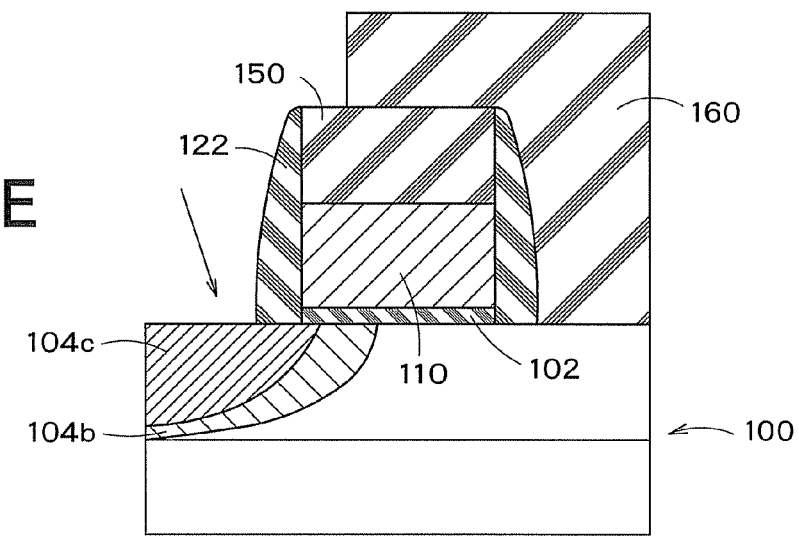
FIG. 7E is a process cross-sectional view subsequent to FIG. 7D.

Next, as illustrated in FIG. 7E, a resist 160 which covers a drain side is formed by a lithography method. Further, ions are injected using arsenic or phosphorus to form a pocket region 104c on the surface portion of the semiconductor substrate 100. The ions may be injected at the low tilt angle or vertically with respect to the semiconductor substrate 100. In a source-drain direction (a horizontal direction in FIG. 7), the drain side end portion of the source extension region 104b is positioned closer to a drain side than the drain side end portion of the pocket region 104c.

Figure 7F:
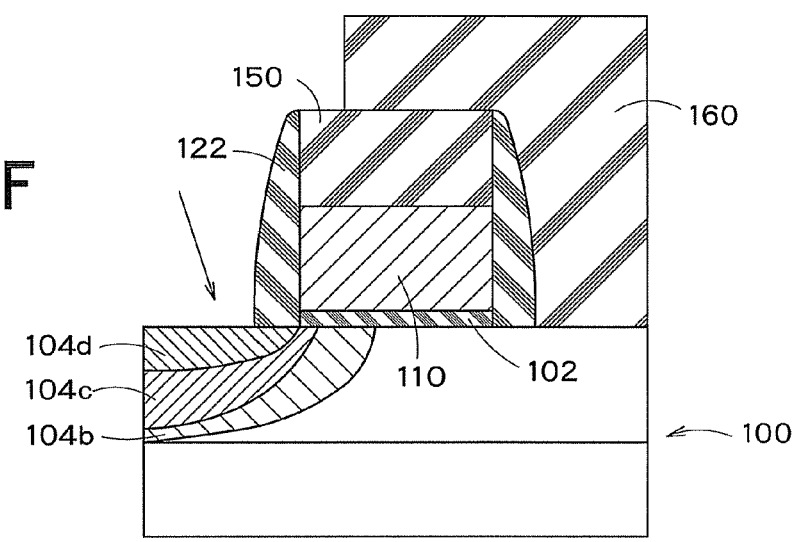
FIG. 7F is a process cross-sectional view subsequent to FIG. 7E.

Next, as illustrated in FIG. 7F, ions are injected using B or $BF_2$ to form the second source extension region 104d on the surface portion of the semiconductor substrate 100. Meanwhile, a dose amount of ion injection is greater than a dose amount of ion injection in process illustrated in FIG. 7C. After ion injection, anneal processing such as RTA is performed to perform crystalline recovery.

Figure 7G:
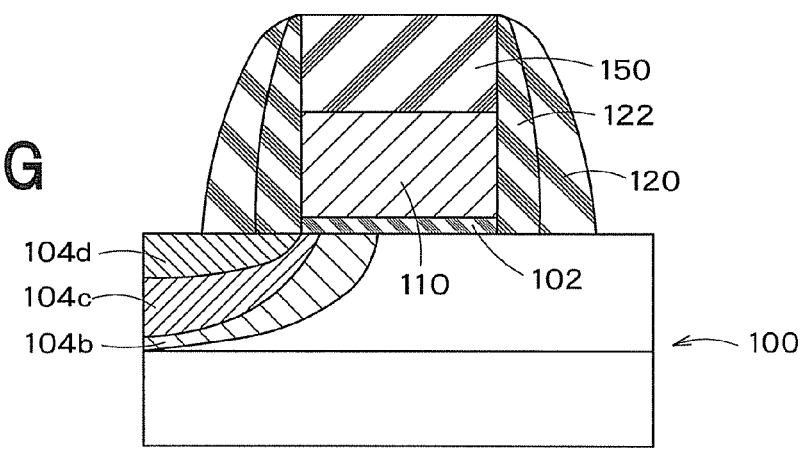
FIG. 7G is a process cross-sectional view subsequent to FIG. 7F.

Next, as illustrated in FIG. 7G, after the resist 160 is peeled, sidewall insulation films 120 are formed on both side surfaces of the gate electrode 110 across the sidewall insulation films 122. The sidewall insulation films 120 are formed by, for example, depositing sidewall insulation film 120 TEOS films on the entire surface on the semiconductor substrate 100 by CVD, and anisotropic etching these TEOS films by RIE.

Figure 7H:
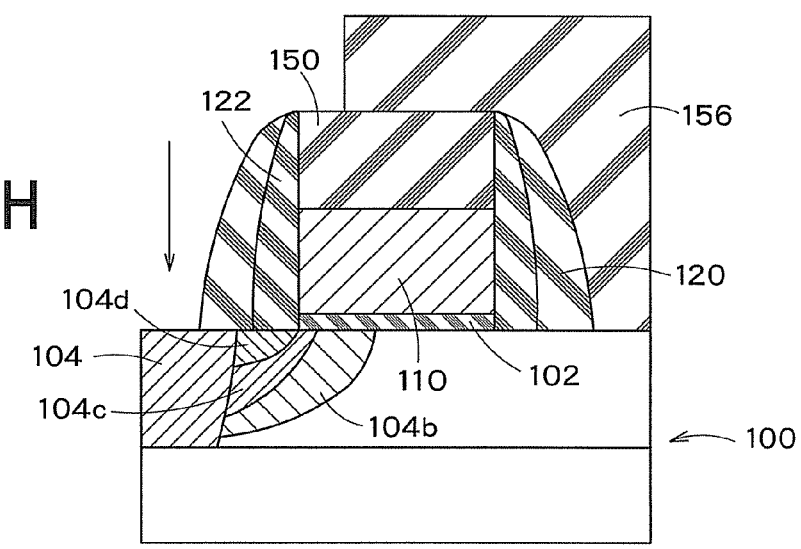
FIG. 7H is a process cross-sectional view subsequent to FIG. 7G.

Next, as illustrated in FIG. 7H, a resist 156 which covers the drain side is formed by the lithography method. Further, ions are injected to form the source region 104. In this case, B or $BF_2$ is used as ion species.

Figure 7I:
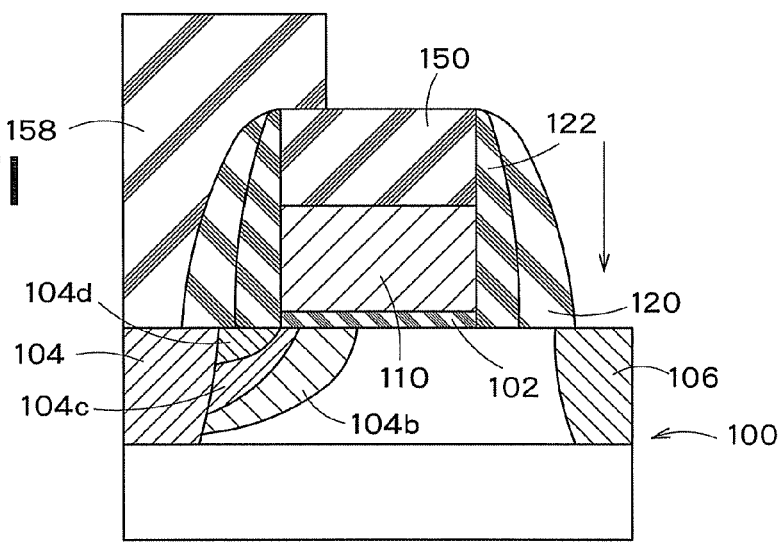
FIG. 7I is a process cross-sectional view subsequent to FIG. 7H.

Next, as illustrated in FIG. 7I, after the resist 156 is peeled, a resist 158 which covers the source side is formed by the lithography method. Further, ions are injected to form a drain region 106. In this case, As or P is used as ion species. Further, after the resist 158 is peeled, anneal processing such as RTA is performed to activate impurities.

Next, as illustrated in FIG. 7J, the insulation film 150 on the gate electrode 110 is peeled by wet etching.

Next, as illustrated in FIG. 7K, silicide layers 104a, 106a and 110a are formed in a self-aligning manner by salicide process. The silicide layer is, for example, an alloy with low resistance silicon such as NiSi, $NiSi_2$ and $Co_2Si$.

Thus, as illustrated in FIG. 6, a tunnel transistor is manufactured in which the pocket region 104c is covered by the source extension region 104b, which prevents deterioration of sub-threshold swing and in which BTBT occurs in the horizontal direction (source-drain direction).

(Third Embodiment) Although an example has been described with the first embodiment where a SOI substrate is used as a semiconductor substrate 100, a bulk substrate may be used. A method of manufacturing a tunnel transistor using a bulk substrate will be described using FIGS. 8A to 8I.

First, as illustrated in FIG. 8A, P type impurities such as boron are injected to a bulk Si substrate which becomes a semiconductor substrate 100 and annealing is performed to form a channel region 100a. Further, a silicon oxide film 1020 which becomes a gate insulation film 102 is formed on the semiconductor substrate 100 by a thermal oxidation method. Subsequently, an electrode material 1100 for the gate electrode 110 is deposited on the silicon oxide film 1020 by way of CVD (Chemical Vapor Deposition). The electrode material is, for example, polysilicon, and is doped with N type impurities such as phosphorus. Further, an insulation film (gate hard mask material) 150 such as $Si_3N_4$ film is formed on the electrode material.

The channel region 100a may be formed by causing epitaxial growth of Si doped with the impurities.

Next, as illustrated in FIG. 8B, a resist 152 is coated on the insulation film 150, and the insulation film 150 is processed by lithography and RIE (Reactive Ion Etching). Further, the electrode material 1100 and the silicon oxide film 1020 are processed using the insulation film 150 as a mask to form the gate electrode 110 and the gate insulation film 102. Before the gate electrode 110 and the gate insulation film 102 are formed, the resist 152 may be peeled.

Next, as illustrated in FIG. 8C, a resist 154 which covers a drain side is formed by a lithography method. Further, ions are injected to form a source extension region 104b. In this case, for example, B or $BF_2$ is used as ion species and is injected to the semiconductor substrate 100 by tilting a beam such that the ion species go around to a lower portion of the gate electrode 110. Although ions are injected twice by changing injection angles in the first embodiment, injecting ions at a high tilt angle may be skipped in the present embodiment.

Figure 8D:
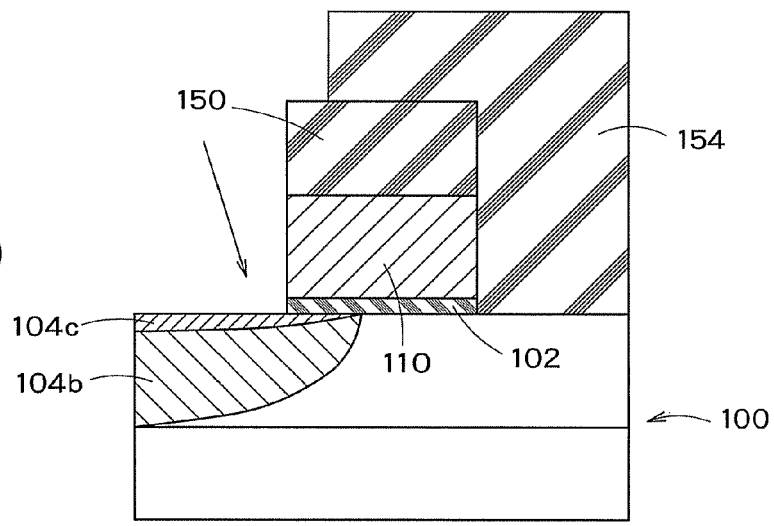
FIG. 8D is a process cross-sectional view subsequent to FIG. 8C.

Next, as illustrated in FIG. 8D, ions are injected using arsenic or phosphorus to form a pocket region 104c on the surface portion of the semiconductor substrate 100. The ions are injected at the low tilt angle or vertically with respect to the semiconductor substrate 100. After ion injection, anneal processing such as RTA is performed to perform crystalline recovery.

Figure 8E:
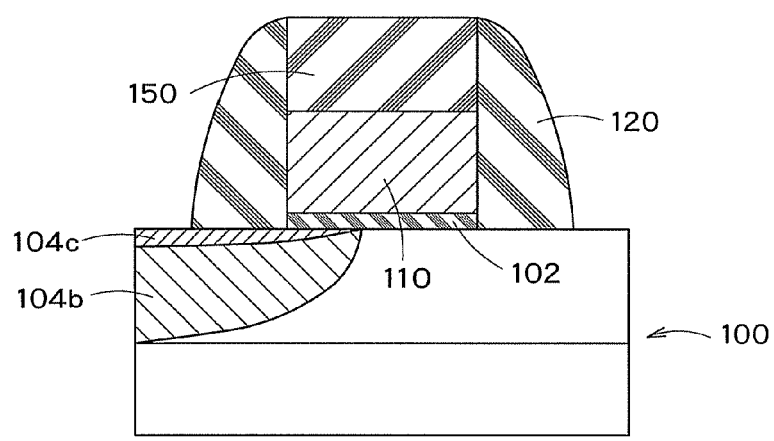
FIG. 8E is a process cross-sectional view subsequent to FIG. 8D.

Next, as illustrated in FIG. 8E, after the resist 154 is peeled, sidewall insulation films 120 are formed on both side surfaces of the gate electrode 110. The sidewall insulation films 120 are formed by, for example, depositing sidewall insulation film 120 TEOS films on the entire surface on the semiconductor substrate 100 by CVD, and anisotropic etching these TEOS films by RIE.

Figure 8F:
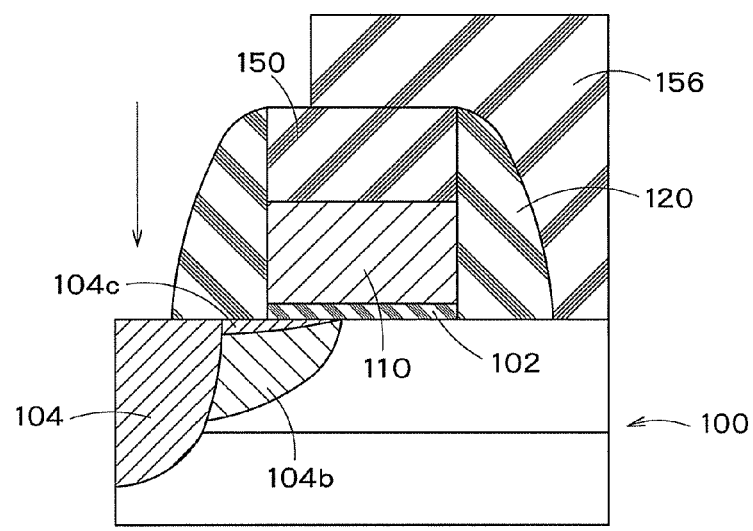
FIG. 8F is a process cross-sectional view subsequent to FIG. 8E.

Next, as illustrated in FIG. 8F, a resist 156 which covers the drain side is formed by the lithography method. Further, ions are injected to form a source region 104. In this case, B or $BF_2$ is used as ion species.

Figure 8G:
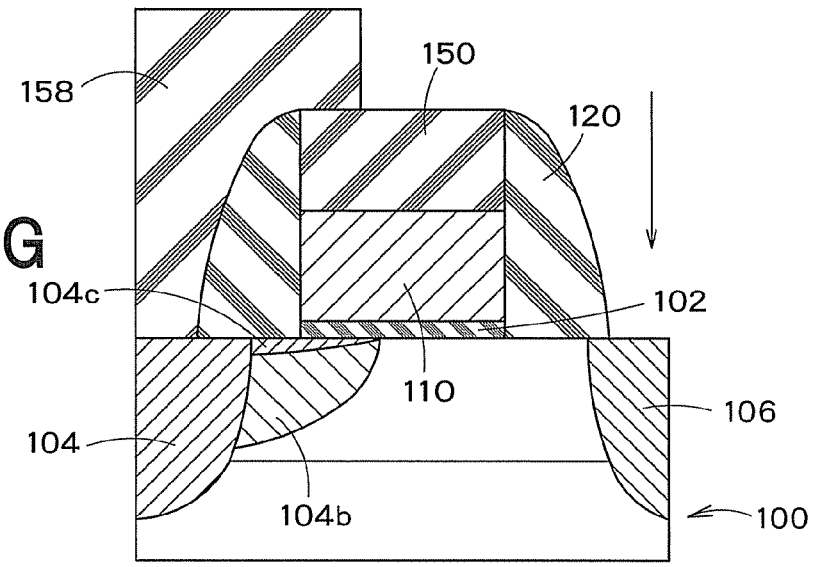
FIG. 8G is a process cross-sectional view subsequent to FIG. 8F.

Next, as illustrated in FIG. 8G, after the resist 156 is peeled, a resist 158 which covers the source side is formed by the lithography method. Further, ions are injected to form a drain region 106. In this case, As or P is used as ion species.

Further, after the resist 158 is peeled, anneal processing such as RTA is performed to activate impurities.

Figure 8H:
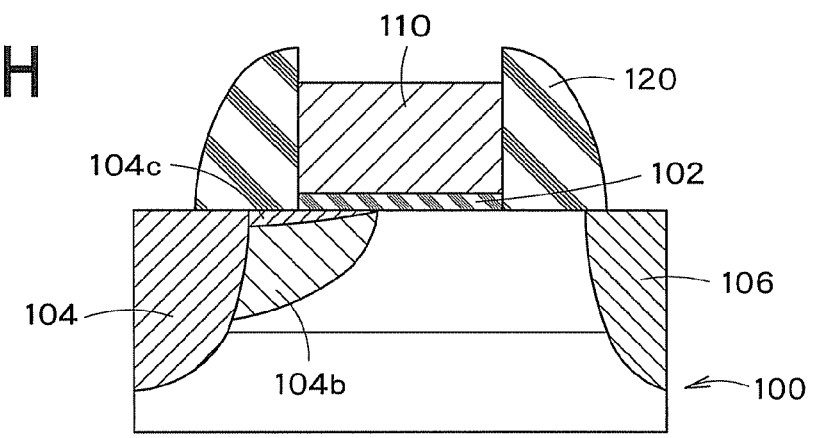
FIG. 8H is a process cross-sectional view subsequent to FIG. 8G.

Next, as illustrated in FIG. 8H, the insulation film 150 on the gate electrode 110 is peeled by wet etching.

Figure 8I:
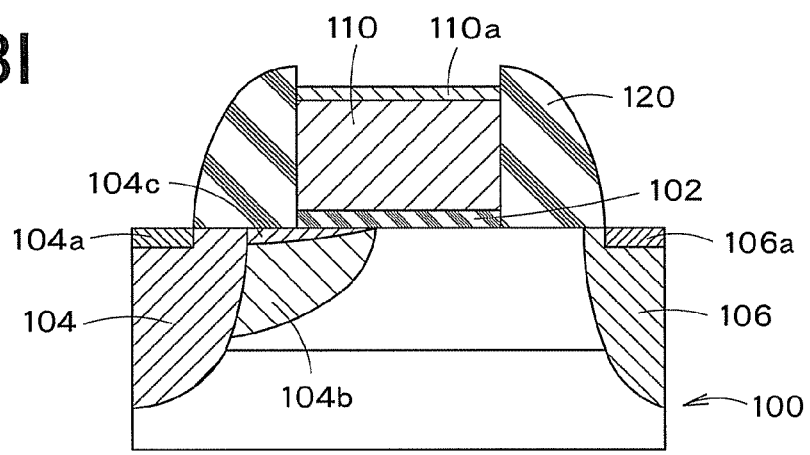
FIG. 8I is a process cross-sectional view subsequent to FIG. 8H.

Next, as illustrated in FIG. 8I, silicide layers 104a, 106a and 110a are formed in a self-aligning manner by salicide process. The silicide layer is, for example, an alloy with low resistance silicon such as NiSi, $NiSi_2$ and $Co_2Si$.

Thus, a tunnel transistor is manufactured in which the N type pocket region 104c is covered by the P type impurity region and which prevents deterioration of sub-threshold swing.

(Fourth Embodiment) Although an example has been described with the first embodiment where a SOI substrate is used as a semiconductor substrate 100, a thin film SOI substrate may be used. A method of manufacturing a tunnel transistor using a thin film SOI substrate will be described using FIGS. 9A to 9I.

First, as illustrated in FIG. 9A, a silicon oxide film 1020 which becomes a gate insulation film 102 is formed on the thin film SOI substrate which becomes a semiconductor substrate 100 by a thermal oxidation method. Subsequently, an electrode material 1100 for the gate electrode 110 is deposited on the silicon oxide film 1020 by CVD method. The electrode material is, for example, polysilicon, and is doped with N type impurities such as phosphorus. Further, an insulation film (gate hard mask material) 150 such as $Si_3N_4$ film is formed on the electrode material.

Next, as illustrated in FIG. 9B, a resist 152 is coated on the insulation film 150, and the insulation film 150 is processed by lithography and RIE (Reactive Ion Etching). Further, the electrode material 1100 and the silicon oxide film 1020 are processed using the insulation film 150 as a mask to form the gate electrode 110 and the gate insulation film 102. Before the gate electrode 110 and the gate insulation film 102 are formed, the resist 152 may be peeled.

Next, as illustrated in FIG. 9C, a resist 154 which covers a drain side is formed by a lithography method. Further, ions are injected to form a source extension region 104b. In this case, for example, B or $BF_2$ is used as ion species and is injected to the semiconductor substrate 100 by tilting a beam such that the ion species go around to a lower portion of the gate electrode 110.

Figure 9D:
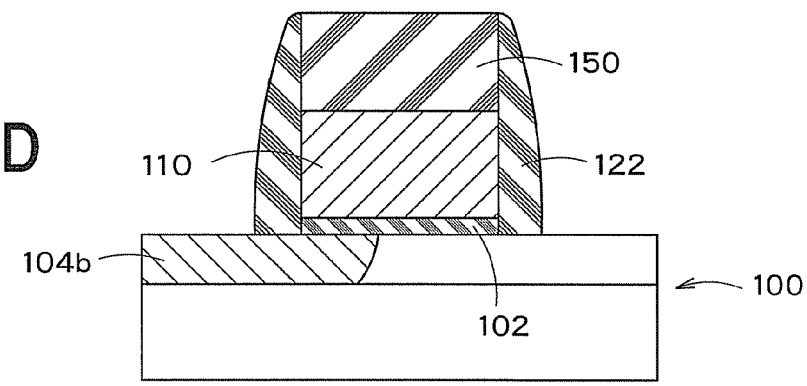
FIG. 9D is a process cross-sectional view subsequent to FIG. 9C.

Next, as illustrated in FIG. 9D, after the resist 154 is peeled, sidewall insulation films (offset spacers) 122 are formed on both side surfaces of the gate electrode 110. The sidewall insulation films 122 are formed by, for example, depositing sidewall insulation film 122 TEOS films on the entire surface on the semiconductor substrate 100 by CVD, and anisotropic etching these TEOS films by RIE. The sidewall insulation films 122 may be, for example, other insulation films such as $Si_3N_4$ films.

Figure 9E:
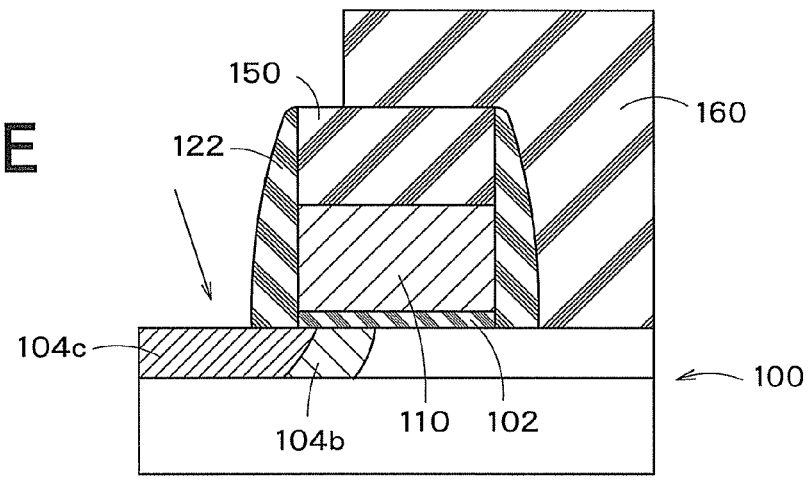
FIG. 9E is a process cross-sectional view subsequent to FIG. 9D.

Next, as illustrated in FIG. 9E, a resist 160 which covers a drain side is formed by a lithography method. Further, ions are injected using arsenic or phosphorus to form a pocket region 104c on the semiconductor substrate. The ions may be injected at the low tilt angle or vertically with respect to the semiconductor substrate 100. In a source-drain direction (a horizontal direction in FIG. 9), the drain side end portion of the source extension region 104b is positioned closer to a drain side than the drain side end portion of the pocket region 104c.

Figure 9F:
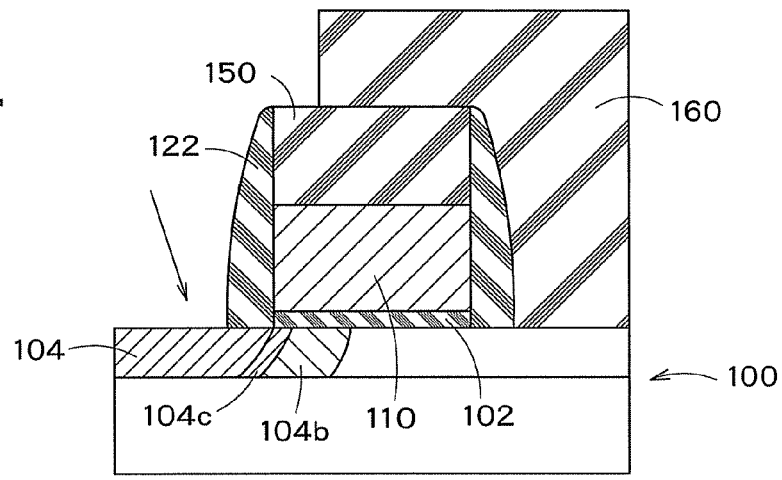
FIG. 9F is a process cross-sectional view subsequent to FIG. 9E.

Next, as illustrated in FIG. 9F, ions are injected using B or $BF_2$ to form a source region 104 on the semiconductor substrate 100. After ion injection, anneal processing such as RTA is performed to perform crystalline recovery.

Figure 9G:
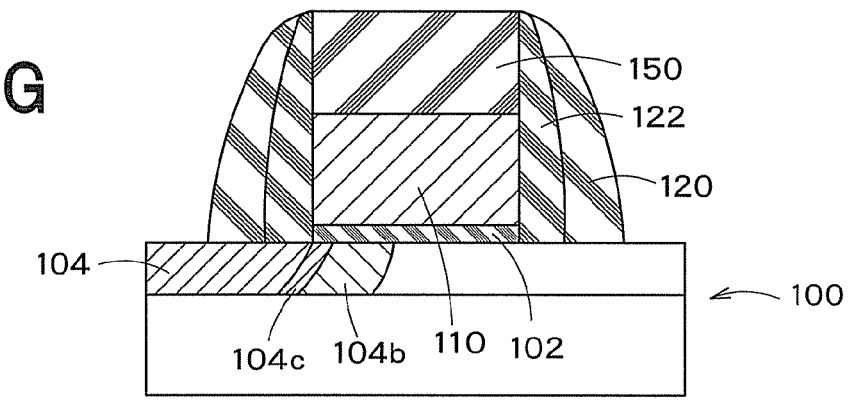
FIG. 9G is a process cross-sectional view subsequent to FIG. 9F.

Next, as illustrated in FIG. 9G, after the resist 160 is peeled, sidewall insulation films 120 are formed on both side surfaces of the gate electrode 110 across the sidewall insulation films 122. The sidewall insulation films 120 are formed by, for example, depositing sidewall insulation film 120 TEOS films on the entire surface on the semiconductor substrate 100 by CVD, and anisotropic etching these TEOS films by RIE.

Figure 9H:
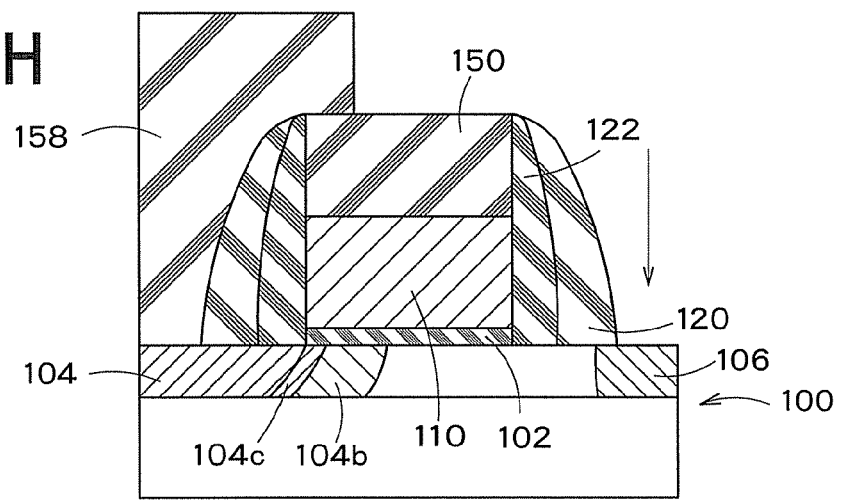
FIG. 9H is a process cross-sectional view subsequent to FIG. 9G.

Next, as illustrated in FIG. 9H, a resist 158 which covers the source side is formed by the lithography method. Further, ions are injected to form a drain region 106. In this case, As or P is used as ion species. Further, after the resist 158 is peeled, anneal processing such as RTA is performed to activate impurities.

Figure 9I:
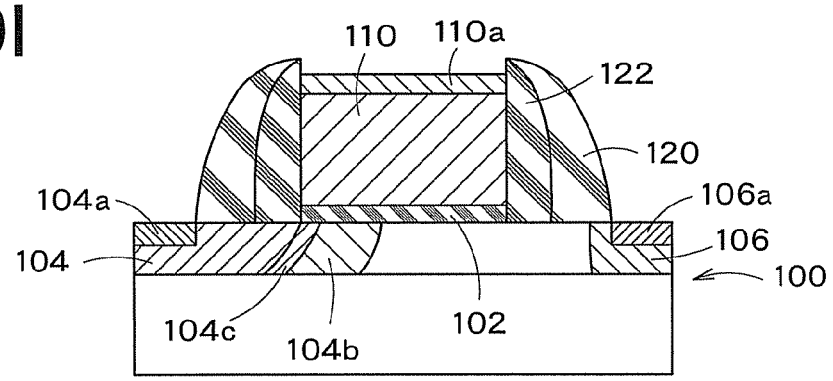
FIG. 9I is a process cross-sectional view subsequent to FIG. 9H.

Next, as illustrated in FIG. 9I, the insulation film 150 on the gate electrode 110 is, peeled by wet etching. Next, silicide layers 104a, 106a and 110a are formed in a self-aligning manner by salicide process. The silicide layer is, for example, an alloy with low resistance silicon such as NiSi, $NiSi_2$ and $Co_2Si$.

Thus, a tunnel transistor is manufactured in which the pocket region 104c is covered by the source extension region 104b, which prevents deterioration of sub-threshold swing and which uses the thin film SOI substrate.

Although the N type tunnel transistor has been described with the first to fourth embodiments, the present invention can also be applied to a P type tunnel transistor by changing types of impurities appropriately.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a first diffusion layer of a first conductive type and a second diffusion layer of a second conductive type which is a reverse conductive type of the first conductive type, the first conductive type first diffusion layer and the second conductive type second diffusion layer being spaced apart and provided in a semiconductor layer;
a gate insulation film which is provided on the semiconductor layer between the first diffusion layer and the second diffusion layer;
a gate electrode which is provided on the gate insulation film;
a pocket region of the second conductive type which is provided on a surface portion of the semiconductor layer adjacently to the first diffusion layer; and
a first extension region of the first conductive type which is provided in the semiconductor layer to cover at least a portion of the pocket region,
wherein a second diffusion layer side end portion of the first extension region is positioned closer to a second diffusion layer side than a second diffusion layer side end portion of the pocket region, and
wherein one of the first and second diffusion layers is a source, and the other of the first and second diffusion layers is a drain.

2. The semiconductor device according to claim 1, wherein the first extension region is in contact with the first diffusion layer.

3. The semiconductor device according to claim 2, wherein the first diffusion layer of the first conductive type is a P type source region and the second diffusion layer of the second conductive type is an N type drain region.

4. The semiconductor device according to claim 1, further comprising a second extension region of the first conductive type which is provided on the surface portion of the semiconductor layer adjacently to the first diffusion layer,
 wherein a second diffusion layer side end portion of the second extension region is positioned closer to a first diffusion layer side than the second diffusion layer side end portion of the pocket region.

5. The semiconductor device according to claim 4, wherein an impurity concentration of the second extension region is higher than an impurity concentration of the first extension region.

6. The semiconductor device according to claim 5, wherein the first extension region is in contact with the first diffusion layer.

7. The semiconductor device according to claim 6, wherein the first diffusion layer of the first conductive type is a P type source region, and the second diffusion layer of the second conductive type is an N type drain region.

8. The semiconductor device according to claim 1, wherein the pocket region is provided between the first diffusion layer and the first extension region, and the first extension region is provided spaced apart from the first diffusion layer.

9. The semiconductor device according to claim 1, wherein the first diffusion layer of the first conductive type is a P type source region, and the second diffusion layer of the second conductive type is an N type drain region.

10. The semiconductor device according to claim 1, wherein a first diffusion layer side end portion of the pocket region intervenes between the surface portion of the semiconductor layer and a first diffusion layer side end portion of the first extension region.

\* \* \* \* \*